United States Patent
Cho et al.

[11] Patent Number: 5,888,871
[45] Date of Patent: Mar. 30, 1999

[54] METHODS OF FORMING EEPROM MEMORY CELLS HAVING UNIFORMLY THICK TUNNELLING OXIDE LAYERS

[75] Inventors: Myoung-Kwan Cho; Keon-Soo Kim, both of Kyungki-do, Rep. of Korea

[73] Assignee: Samsung Electronics Co., Ltd., Suwon, Rep. of Korea

[21] Appl. No.: 774,100

[22] Filed: Dec. 24, 1996

[51] Int. Cl.$^6$ ............................................... H01L 21/8247
[52] U.S. Cl. ........................ 438/263; 438/450; 438/452
[58] Field of Search .................................. 438/263, 264, 438/297, 298, 449, 450, 451, 452

[56] References Cited

U.S. PATENT DOCUMENTS

| | | | |
|---|---|---|---|
| 5,110,756 | 5/1992 | Gregor et al. | 438/452 |
| 5,147,813 | 9/1992 | Woo | 438/263 |
| 5,286,666 | 2/1994 | Katto et al. | 438/450 |
| 5,521,109 | 5/1996 | Hsue et al. | 438/263 |
| 5,663,080 | 9/1997 | Cereda et al. | 438/450 |

*Primary Examiner*—Chandra Chaudhari
*Attorney, Agent, or Firm*—Myers Bigel Sibley & Sajovec

[57] ABSTRACT

Methods of forming EEPROM memory cells having uniformly thick tunnelling oxide layers include the steps of forming a preliminary field oxide isolation region of first thickness at a face of a semiconductor substrate of first conductivity type (e.g., P-type) and then forming a tunneling oxide layer on the face, adjacent the preliminary field oxide isolation region. The memory cell's drain region dopants are then implanted through the preliminary field oxide isolation region and into the substrate to form a preliminary drain region of second conductivity type. The preliminary field oxide isolation region is then grown to a second thickness greater than the first thickness by oxidizing the portion of the substrate containing the implanted dopants, to form a final field oxide isolation region which may have a thickness of about 2000 Å. To prevent unwanted growth of the tunnelling oxide layer, a silicon nitride layer is preferably patterned on the tunnelling oxide layer and used as an oxidation mask during the step of growing the preliminary field oxide isolation region to a second thickness. The silicon nitride mask is then removed and then a floating gate electrode and insulated control electrode are patterned on the tunnelling oxide layer and channel region to complete the memory cell.

17 Claims, 9 Drawing Sheets

5,888,871

METHODS OF FORMING EEPROM MEMORY CELLS HAVING UNIFORMLY THICK TUNNELLING OXIDE LAYERS

FIELD OF THE INVENTION

The present invention relates to semiconductor devices and fabrication methods, and more particularly to methods of forming integrated circuit memory devices and memory devices formed thereby.

BACKGROUND OF THE INVENTION

Recently, various devices controlled by computers and microprocessors have been replaced by high density nonvolatile semiconductor memory devices. Particularly, in the case of portable computers or notebook size computer systems using battery power, a hard disk device with rotatable magnetic disk used as an auxiliary memory device typically occupies relatively large space. Thus, designers of such systems have become interested in developing electrically erasable and programmable nonvolatile semiconductor memory devices with high density and high performance.

FIG. 1 is a plan view showing a nonvolatile semiconductor memory device containing EEPROM memory cells therein, according to the prior art. Referring to FIG. 1, N type buried diffusion layers 1 used as source/drain regions are extended in a vertical direction under a thick oxide layer, and control gates 2 constituting word lines are extended in a horizontal direction. Under the control gates 2, floating gates 3 cover a portion of the channel regions and a partial portion of the thick oxide layer over the N type buried diffusion layers 1. In this construction, however, as the length of the N type buried diffusion layers 1 increase, their resistance also increases, thus lowering the read and program speed of the cells. In addition, with the increase in capacitance between the bit line and the substrate, the charging speed of the bit lines is lowered and the reading speed is deteriorated.

FIG. 2 is a plan view showing another nonvolatile semiconductor memory device according to the prior art. Here, in order to reduce the diffusion layer resistance, contact holes 4 are formed as shown in FIG. 2, thereby minimizing the extension length of the N type buried diffusion layers 1. That is, by connecting the N type buried diffusion layers 1 to the contact holes 4 via metal wires 5, the resistance can be reduced. However, this construction raises another problem because the formation of the contact holes 4 increases the horizontal size of the memory cell array. Thus, even if the minimum length 6 between adjacent contact holes, the minimum length 7 between one contact hole and an active region and the minimum length 8 between adjacent active regions is achieved, an increase in the horizontal size of the memory cell array is inevitable.

Although the use of contact holes may reduce the resistance to some degree, it typically causes an increase in the capacitance between the substrate and the bit lines. FIG. 3 is an equivalent circuit diagram of the device of FIG. 1. The operation of the cells will now be explained with reference to FIG. 3 and the following TABLE 1.

TABLE 1

|  |  | selected W/L | unselected W/L | B/L K − 1 | B/L K | B/L K + 1 | Substrate |
|---|---|---|---|---|---|---|---|
| selected cell | program | Vpp | 0 V | 0 V | Vd | F | 0 V |
|  | erase | −Vg | 0 V | 0 V | Vcc | 0 V | 0 V |
|  | read | Vcc | 0 V | 0 V | Vd | F | 0 V |

Referring to FIG. 3 and TABLE 1, in the case that cell A is selected for programming, approximately 6–7 Volts is applied to the bit line B/L K, 12 Volts is applied to the selected word line W/L 3 and 0 Volts is applied to the bit line B/L K−1. The application of these potentials causes an injection of hot electrons into the floating gate as will be understood by those skilled in the art. At this point, a ground voltage is also applied to the unselected word lines and the other bit lines B/L K+1 are allowed to float ("F"). Unfortunately, the application of 6–7 Volts to the bit line B/L K and 0 Volts to the unselected word lines (i.e., control gates) may cause drain interference where charge stored on the floating gates of unselected cells is removed through Fowler-Nordheim tunnelling. If the number of cells connected to the bit line B/L is N, the drain interference frequency corresponds to N−1.

As illustrated by TABLE 1, an erase operation is performed by removing the electrons stored on the floating gate 3 through Fowler-Nordheim tunneling. This is achieved by applying a negative voltage−Vg to the selected word line W/L 3 and a power supply voltage VCC to the selected bit line B/L K. A read operation is also performed by applying 1.5 Volts (Vd) to the bit line B/L K, the power supply voltage VCC to the selected word line W/L 3 and the ground voltage to the unselected word lines.

FIG. 4 is a cross sectional-view taken along line X–X' in FIG. 2. Referring to FIG. 4, under the thick oxide layer 9, N type buried diffusion layers 1 constituting the source/drain regions of the cells are separated from one another by respective channel regions which extend to the face of the substrate. A floating gate 3 separated from a channel region by the gate oxide layer 15 covers a partial portion of the channel region and a partial portion of the thick oxide layer 9 over the N type buried diffusion layer 1. A control gate 2 covers the floating gate 3 and the portion of the channel region that the floating gate 3 does not cover.

FIGS. 5A to 5E show a conventional process of manufacturing the device of FIG. 4. Referring to FIG. 5A, a pad oxide layer 15a and a silicon nitride layer 11 are sequentially deposited over the substrate 100 and then patterned to define openings therein. Thereafter, arsenic ions are implanted into the openings to form the N type buried diffusion layer 1. Then, a plurality of thick oxide layers 9 are formed by thermally oxidizing the openings at 900° C. for over 10 hours.

Referring to FIG. 5B, after removing the silicon nitride layer 11 and the pad oxide layer 15a, a tunnel oxide layer 10 is grown. Thereafter, a first layer of polysilicon 3 is deposited over the tunnel oxide layer 10. Openings are then formed by patterning the layer of polysilicon and the tunnel oxide layer 10 via a typical photo etching process using the photosensitive film 12 as an etching mask. This patterning step defines a first polysilicon pattern 3a. When forming the tunnel oxide layer 10, due to the lateral diffusion of the ions implanted to form the N type buried diffusion layer 1, the oxide layer over the channel region adjacent to the N type buried diffusion layer 1 becomes thicker than that over the channel region which is not affected by the lateral diffusion of the implanted ions. In addition, with an increase in the ion density to decrease the resistance of the drain region, the thickness difference in the oxide layer becomes greater, causing uneven device characteristics. That is, during the memory cell's program mode of operation, the uneven thickness of the tunnelling oxide layer causes an unevenness in the threshold voltage of the cell. This problem also exists during the erase operation. In particular, when erasing using Fowler-Nordheim current from the floating gate to the source or drain, the unevenness in the cell's electrical characteristic becomes much greater.

Referring now to FIG. 5C, an interlayer insulating film 13 is formed over the first polysilicon pattern 3a and over the portion of the channel region that the first polysilicon pattern 3a does not cover, by a thermal oxidation process. Thereafter, a second layer of polysilicon for the control gate 2 is deposited thereon, and then the second layer of polysilicon, the interlayer insulating film 13 and the first polysilicon pattern 3a are etched via the photoetching process to form the control gate 2 and the floating gates 3. The problem in this etching process will be discussed with reference to FIGS. 5D and 5E.

FIG. 5D is a cross sectional view taken along line Z–Z' in FIG. 2. FIG. 5E is a cross sectional view taken along line Y–Y' in FIG. 2. In etching the second layer of polysilicon, the interlayer insulating film 13 and the first polysilicon pattern 3a via the photo etching process, the substrate 100 is not exposed. However, when etching the interlayer insulating film 13 after etching the second layer of polysilicon in the construction of FIG. 5E, there occurs a problem that the oxide layer is also etched, thus exposing the surface of the substrate 100. The exposed substrate is damaged during the etching process for forming the floating gate, making it impossible to obtain a normal contact characteristic.

Thus, notwithstanding the above described methods of forming nonvolatile memory devices containing EEPROM memory cells, there continues to be a need for methods of forming memory devices having improved electrical characteristics.

SUMMARY OF THE INVENTION

It is therefore an object of the present invention to provide improved methods of forming integrated circuit memory devices.

It is another object of the present invention to provide methods of forming EEPROM memory cells with improved electrical characteristics.

It is a further object of the present invention to provide methods of forming EEPROM memory cells having uniformly thick tunnelling oxide layers.

These and other objects, advantages and features of the present invention are provided by methods of forming EEPROM memory cells with improved electrical characteristics resulting from the formation of uniformly thick tunnelling oxide layers. According to preferred embodiments of the present invention, a tunnelling oxide layer of an EEPROM memory cell is formed prior to complete formation of a field oxide isolation region and before implantation of the cell's drain region dopants. These sequence of steps limit the likelihood that the thickness of the cell's tunnelling oxide layer will vary across the length of the cell's channel region as a function of the concentration of the implanted drain region dopants.

In particular, preferred methods of forming EEPROM memory cells with uniformly thick tunnelling oxide layers include the steps of forming a preliminary field oxide isolation region of first thickness at a face of a semiconductor substrate of first conductivity type (e.g., P-type) and then forming a tunneling oxide layer on the face, adjacent the preliminary field oxide isolation region. The memory cell's drain region dopants are then implanted through the preliminary field oxide isolation region and into the substrate to form a preliminary drain region of second conductivity type. The preliminary field oxide isolation region is then grown to a second thickness greater than the first thickness by oxidizing the portion of the substrate containing the implanted dopants, to form a final field oxide isolation region which may have a thickness of about 2000 Å. To prevent unwanted growth of the tunnelling oxide layer, a silicon nitride layer is preferably patterned on the tunnelling oxide layer and used as an oxidation mask during the step of growing the preliminary field oxide isolation region to a second thickness. The silicon nitride mask is then removed and then a floating gate electrode and insulated control electrode are patterned on the tunnelling oxide layer and channel region to complete the memory cell.

DESCRIPTION OF PREFERRED EMBODIMENTS

Figure 1:
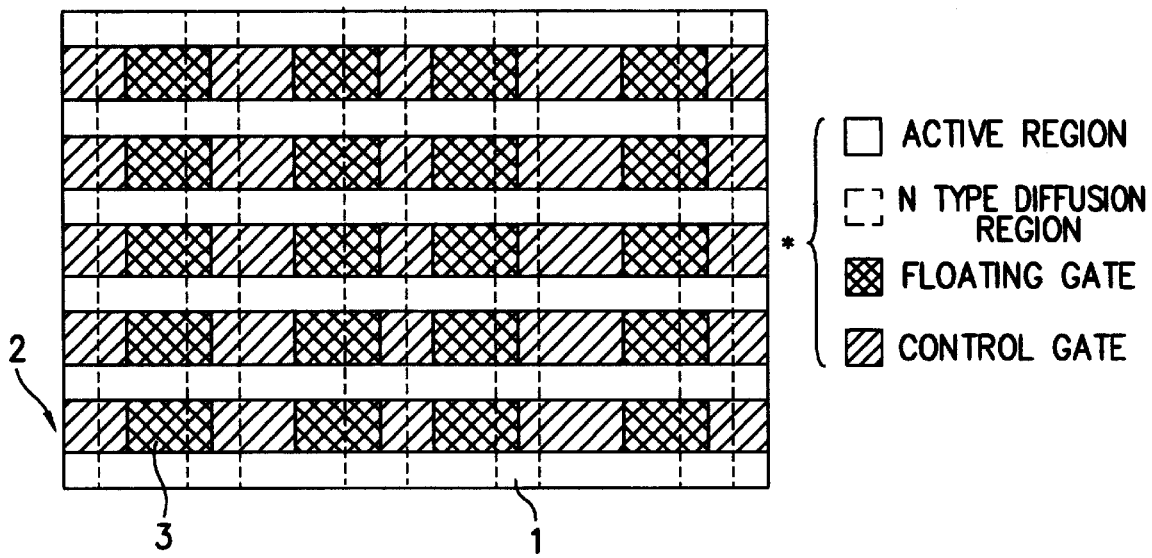
FIG. 1 is a plan layout view of a first integrated circuit memory device containing EEPROM memory cells, according to the prior art.
Figure 2:
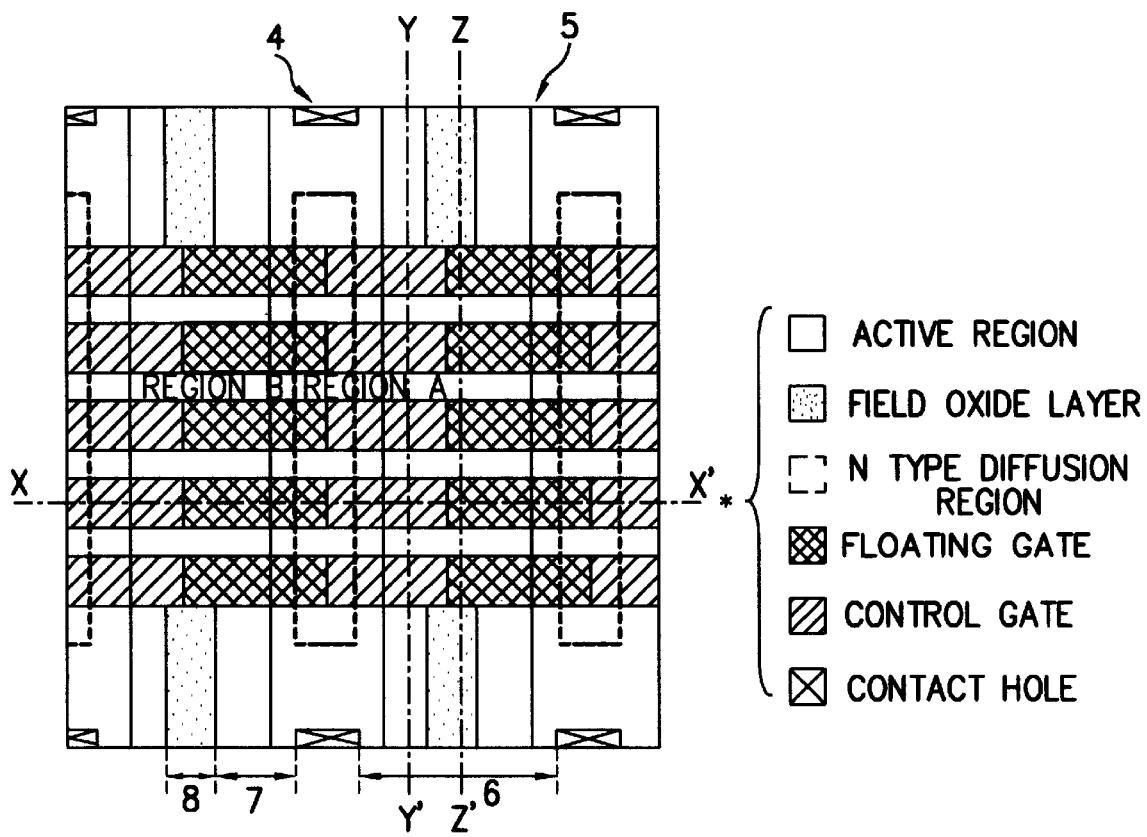
FIG. 2 is a plan layout view of a second integrated circuit memory device containing EEPROM memory cells, according to the prior art.
Figure 3:
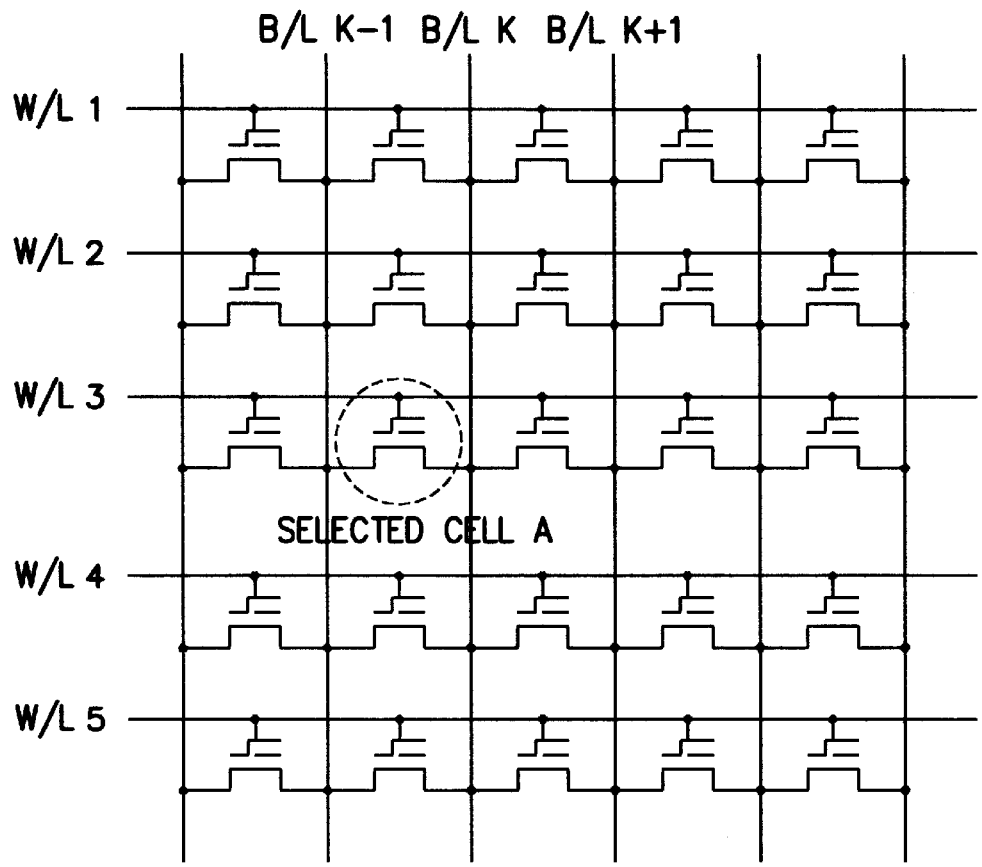
FIG. 3 is an electrical schematic of the integrated circuit memory device of FIG. 1.
Figure 4:
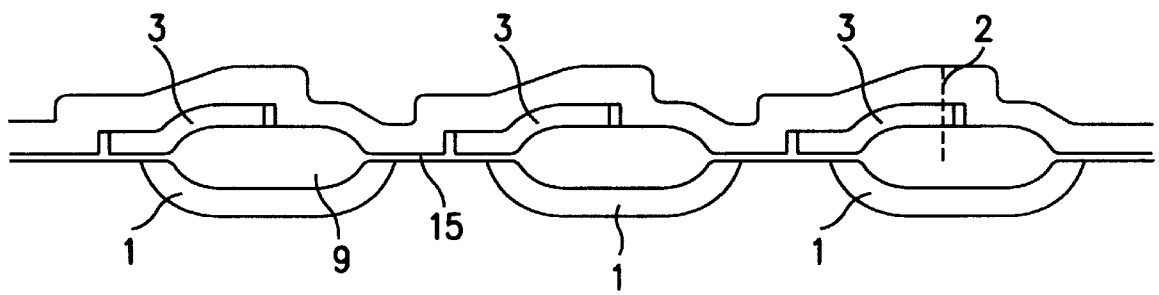
FIG. 4 is a cross-sectional view of the memory device of FIG. 2, taken along line X–X'.
Figure 5A:
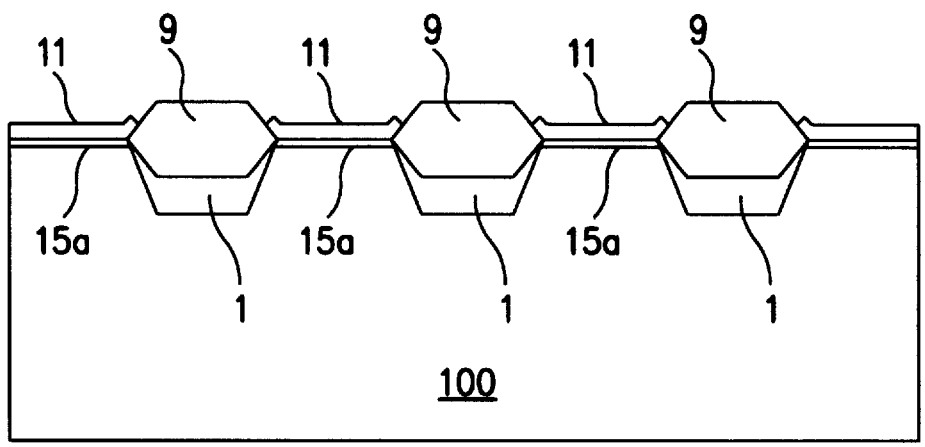
FIGS. 5A–5E illustrate schematic cross-sectional views of intermediate structures which describe a conventional method of forming the memory device of FIG. 4.
Figure 5B:
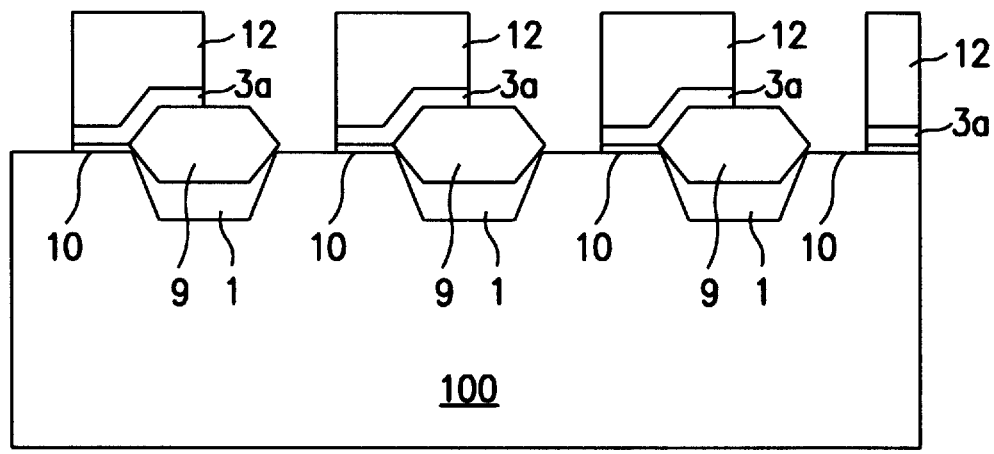
Figure 5C:
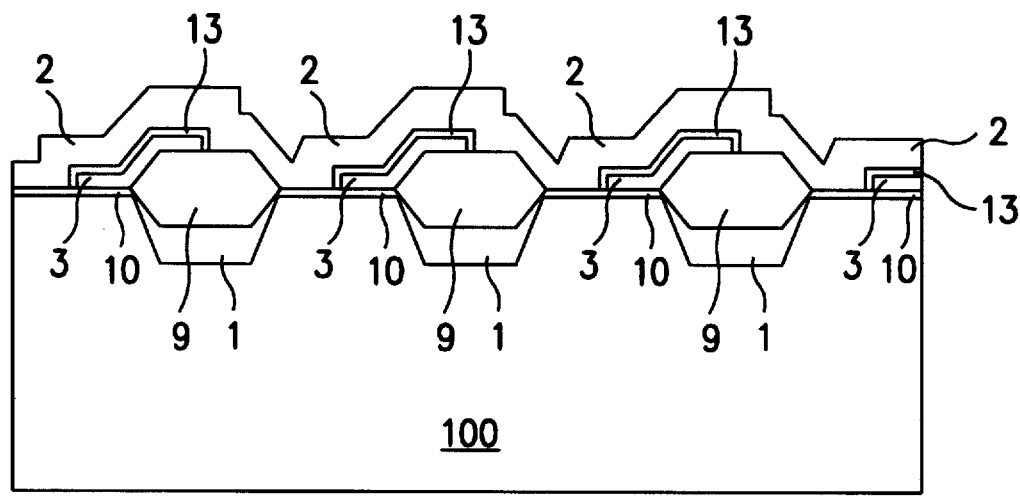
Figure 5D:
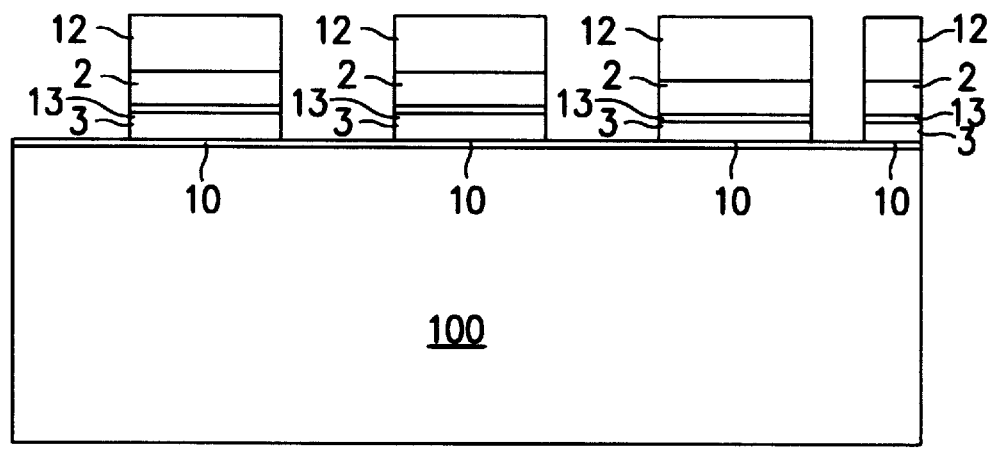
Figure 5E:
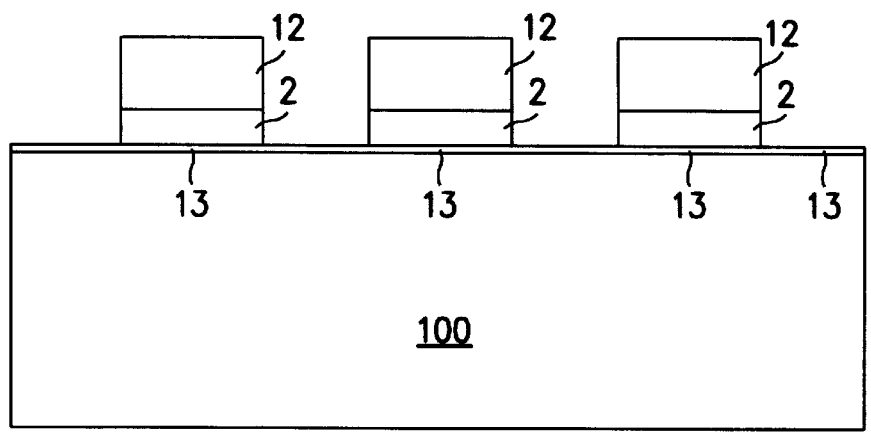

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers in FIGS. 6–8E refer to like elements. Moreover, the terms "first conductivity type" and "second conductivity type" refer to opposite conductivity types such as P or N-type, however, each embodiment described and illustrated herein includes its complementary embodiment as well.

Figure 6:
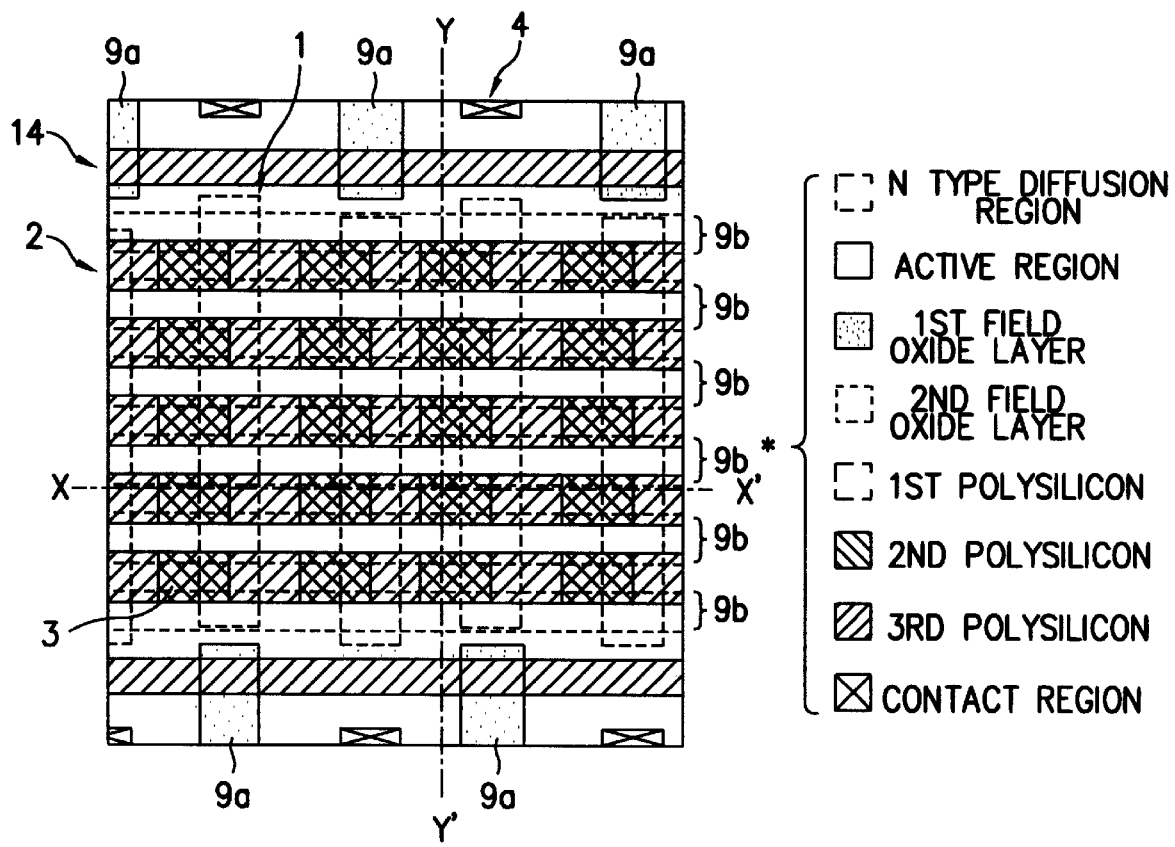
FIG. 6 is a plan layout view of an integrated circuit memory device according to an embodiment of the present invention.
Figure 7:
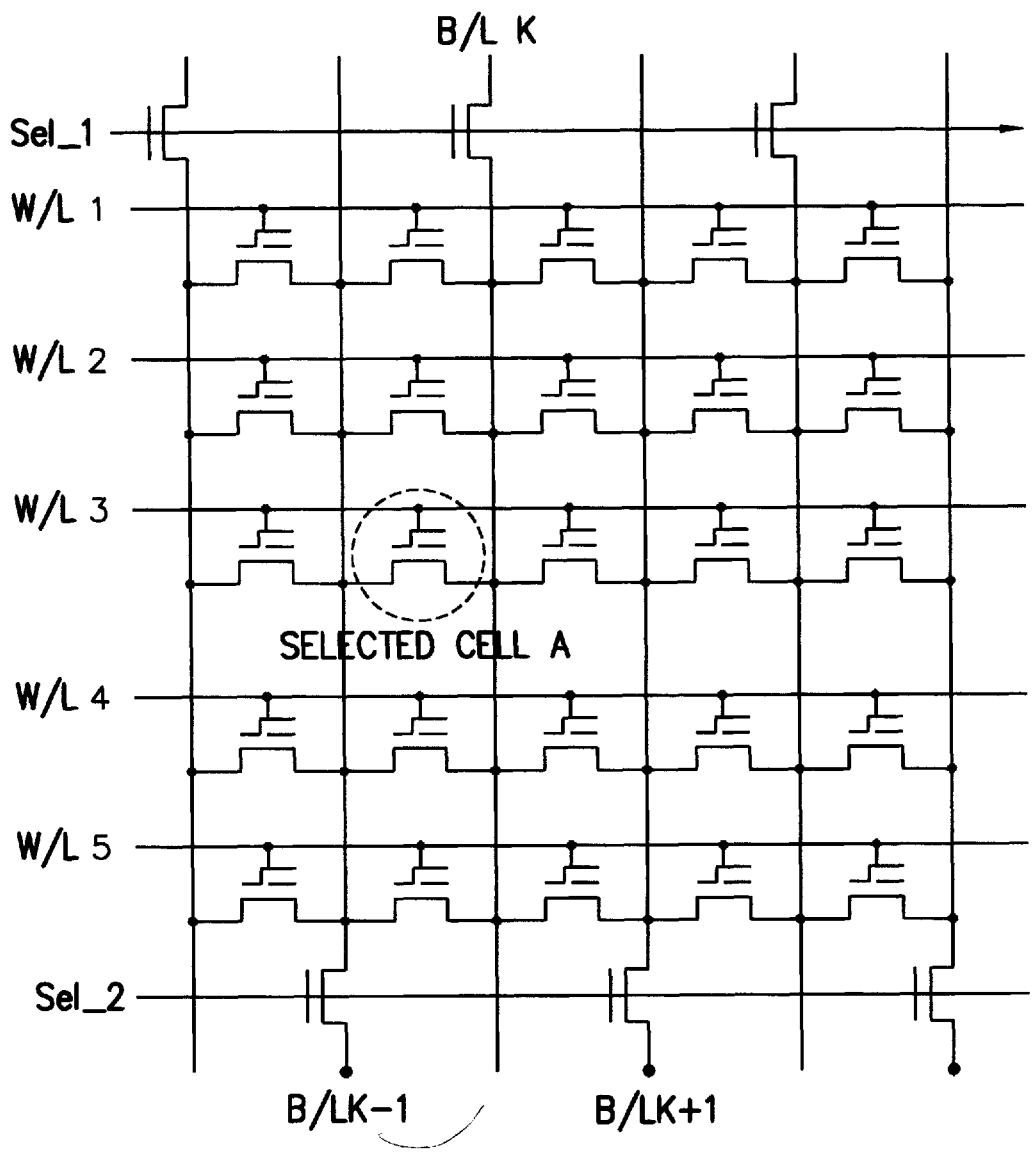
FIG. 7 is an electrical schematic of the integrated circuit memory device of FIG. 6.

FIG. 6 is a plan view showing an electrically erasable and programmable nonvolatile semiconductor memory device according to the present invention. The memory device contains EEPROM memory cells therein. FIG. 7 is an electrical schematic of the memory device of FIG. 6. Referring to FIGS. 6–7, block select transistors 14 which are formed by forming a third polysilicon layer over first field oxide layers 9a in a horizontal direction, are extended in the horizontal direction in the upper and lower portions of the cell array. A second field oxide layer is extended in the horizontal direction between the first field oxide layers 9a. N type buried diffusion layers 1, used as bit lines and the source/drain regions of the cells, are extended in a vertical direction under the second field oxide layer, and control gates 2 constituting the word line are extended in the horizontal direction between the second field oxide layers 9. Under the control gate 2, a floating gate 3 which is electrically insulated from the control gate 2 covers a partial portion of the channel region and a partial portion of the thick oxide layer over the N type buried diffusion layer 1. In order to reduce the resistance of the bit line, each contact hole 4 is arranged between the first field oxide layers 9a.

Figure 9:
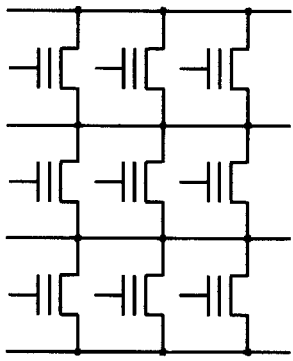
FIG. 9 is a table illustrating potential reductions in memory array area achievable with the present invention.

FIG. 9 shows how much the cell size is reduced according to the present invention. That is, FIG. 9 shows the reduced cell size according to the present invention as compared with the prior art when using a design rule of 0.6 $\mu$m according to the number of the field oxide layers formed at each string and the number of the word lines in each block. The drain interference is minimized by separating the bit lines in each block by the select transistors 14. According to the present invention, it is possible to reduce the resistance of the bit line, reduce the cell size due to the reduction of the contact holes, reduce the capacitance between the N type buried diffusion layer (bit line) and the substrate and minimize the drain interference.

The operation of the memory device of FIG. 7 will now be described with reference to TABLES 3A and 3B.

of the cell and a ground voltage to the unselected word lines and the source of the cell.

As described above, the present invention can solve the problem of increasing the cell size due to the contact holes by a cross arrangement of the contact holes of the bit lines and can reduce the capacitance between the bit line and the substrate and the drain interference by separating the cells into the block unit in a vertical direction by the block select transistors.

Figure 8A:
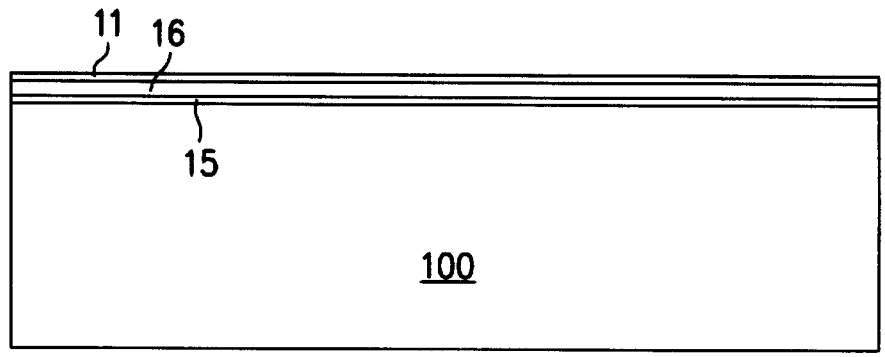
FIGS. 8A–8E illustrate schematic cross-sectional views of intermediate structures which describe a method of forming the integrated circuit memory device of FIG. 6.
Figure 8B:
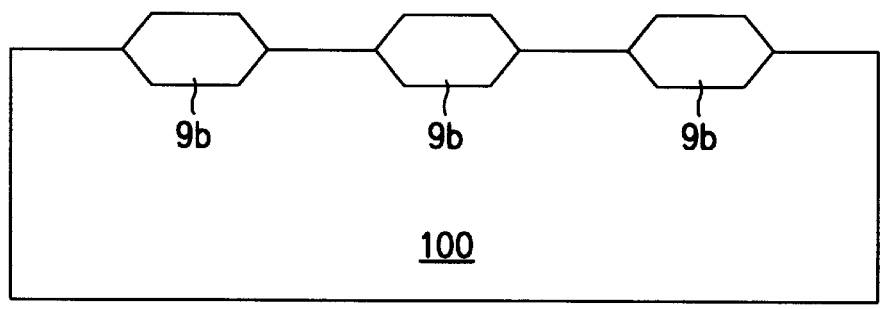

Referring now to FIGS. 8A–8E, preferred methods of forming the integrated circuit memory device of FIGS. 6 and 7 will now be described. In particular, FIG. 8A illustrates the initial steps of forming a pad oxide layer 15 having a thickness of about 300 Å on a face of a semiconductor substrate 100 of first conductivity type (e.g., P-type). Then, a layer 16 of polycrystalline silicon having a thickness of about 1000 Å is formed on the pad oxide layer 15. This step is then followed by the step of forming a layer 11 of silicon nitride ($Sl_3N_4$) having a thickness of about 1000 Å on the polysilicon layer 16. These layers are then patterned using conventional techniques to expose the face of the substrate 100 at a plurality of locations where field oxide isolation regions are to be formed. Referring now to FIG. 8B, the patterned layers are used as a thermal oxidation mask during

TABLE 3A

|  | SEL1 | SEL2 | selected W/L | unselected W/L | selected B/L(K) | unselected B/L(K − 1) | unselected B/L(K + 1) | substrate |
|---|---|---|---|---|---|---|---|---|
| program | Vcc | Vcc | Vpp | 0 V | 0 V | 0 V | F | 0 V |
| erase | Vcc | Vcc | −Vg | 0 V | 5 V | 0 V | 0 V | 0 V |
| read | Vcc | Vcc | Vcc | 0 V | 1 V | 0 V | F | 0 V |

TABLE 3B

|  |  | SEL1 | SEL2 | selected W/L | unselected W/L | B/L K − 1 | B/L K | B/L K + 1 | substrate |
|---|---|---|---|---|---|---|---|---|---|
| selected cell A | program | Vcc | Vcc | Vpp | 0 V | 0 V | Vcc | F | 0 V |
|  | erase | Vcc | Vcc | −Vg | 0 V | 0 V | Vcc | 0 V | 0 V |
|  | read | Vcc | Vcc | Vcc | 0 V | 0 V | Vcc | F | 0 V |

Under the condition of operating the cells by using the F-N tunneling current, the program operation is performed as shown in TABLE 3A. That is, a program voltage is applied to the selected word line W/L3 and 0 Volts is applied to the unselected word lines. And, the power supply voltage is applied to the select transistors SEL1 and SEL2, 0 Volts to all bit lines, and a bit line voltage to the drain of each cell. In order to erase the selected cell A, a negative voltage−Vg is applied to the selected word line W/L3 and 0 Volts to the unselected word lines. In addition, the power supply voltage Vcc is applied to the selected bit line B/L K, 0 Volts to the unselected bit lines, and the bit line voltage to the cell drain.

Table 3B illustrates another cell operating method. The program operation is performed by applying the power supply voltage VCC to the select transistors SEL1 and SEL2 and to the selected bit line B/L K and 15 Volts to the selected word line. The erase operation is performed by applying the power supply voltage VCC to the drain and −12 Volts to the selected word line. The read operation is performed by applying the power supply voltage VCC to the select transistors SEL1 and SEL2, the selected word line and the drain the formation of a plurality of field oxide isolation regions 9b having thickness of about 1000–1500 Å using conventional thermal oxidation techniques. The preliminary field oxide isolation regions 9b, which are also illustrated by FIG. 6 along line Y–Y', define a plurality of active portions of the substrate 100 (i.e., "active regions") therebetween. The patterned layers may then be removed using conventional etching techniques.

Figure 8C:
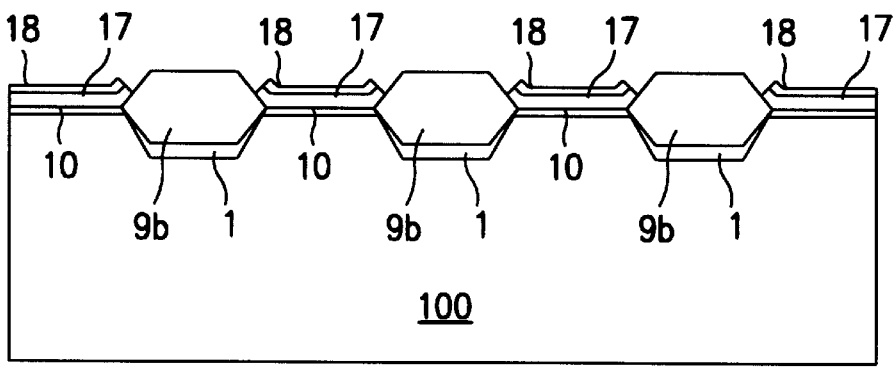

Referring now to FIG. 8C which illustrates an intermediate structure taken along line X–X' in FIG. 6, a tunnelling oxide layer 10 of predetermined uniform thickness is then formed on the active regions. This tunnelling oxide layer 10 may be formed by thermally oxidizing the active regions at the face of the substrate 100. This step is then followed by the steps of forming a first conductive layer 17 on the tunnelling oxide layer 10 and a first layer 18 of silicon nitride on the first conductive layer 17. The first conductive layer 17 may comprise polycrystalline silicon. The first layer 18 of silicon nitride and the first conductive layer 17 are then patterned using conventional photolithography techniques to expose upper surfaces of the field oxide isolation regions 9b.

A portion of the field oxide isolation region 9B is also etched. Using the patterned first layer 18 of silicon nitride as an implant mask, dopants of second conductivity type (e.g., N-type) are then implanted through the field oxide isolation regions 9b and into the substrate 100. The field oxide isolation regions 9b are then grown to a thickness of about 2000 Å by thermally oxidizing the substrate 100 on the N-type doped region 1, using the patterned layer 18 of silicon nitride as an oxidation mask. During this thermal treatment step, the implanted dopants diffuse into the substrate 100 to form a plurality of source/drain regions 1, as illustrated. However, because the tunnelling oxide layer 10 is formed prior to the formation of the source/drain regions 1 in contrast to the prior art, the possibility that the rate oxidation of the tunnelling oxide layer 10 will be altered (i.e., increased) by the presence of drain region dopants is eliminated. Thus, a uniformly thick tunnelling oxide layer 10 can be achieved. In addition, the patterned layer 18 of silicon nitride and the patterned first conductive layer 17 act as an oxidation mask to inhibit additional growth of the tunnelling oxide layer 10.

Figure 8D:
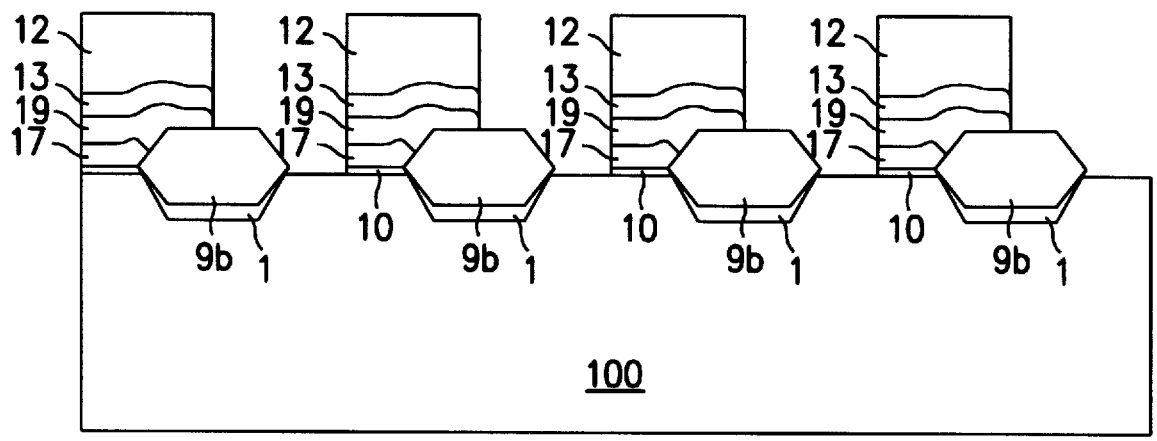

Referring now to FIG. 8D, the patterned first layer 18 of silicon nitride is then removed and a blanket layer of polycrystalline silicon is deposited as a second conductive layer 19. An intermediate insulating layer 13 is then formed as a composite by growing a first interlayer oxide layer to about 130 Å by a dry thermal oxidation process at 900° C., depositing an interlayer nitride layer having a thickness of about 150 Å and then forming a second interlayer oxide layer on the interlayer nitride layer by a wet oxidation process. The intermediate insulating layer, the second conductive layer, the first conductive layer and the tunnelling oxide layer 10 are then patterned by etching these layers using a photosensitive film 12 as an etching mask. This patterning step is preferably performed to define a composite floating gate electrode pattern (regions 17 and 19) and expose a portion of the active region of each memory cell.

Figure 8E:
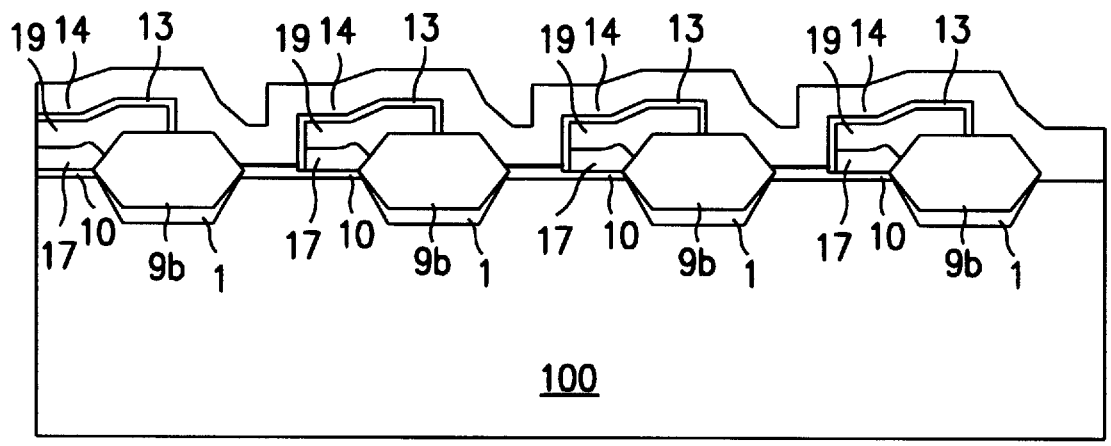

Referring now to FIG. 8E, a thermal oxidation process is then performed to form an oxide insulating layer on the exposed face and then a blanket third conductive layer comprising polycrystalline silicon is deposited on the thermal oxide insulating layer and on the patterned intermediate insulating layer 13, as illustrated. The third conductive layer 14, the intermediate insulating layer 13, the second conductive layer 19 and the first conductive layer 17 are then etched to define the appropriate widths of the control and floating gate electrodes in a third dimension (not shown). In the above etching process, when the third conductive layer 14, the intermediate insulating layer 13 and the second conductive layer 19 are etched, the surface of the substrate is protected from etching damage by the field oxide region 9b.

And, by forming the tunnelling oxide layer prior to incorporation of source/drain region dopants into the substrate, tunnelling oxide layers having uniform thicknesses can be achieved. As will be understood by those skilled in the art, these uniform thicknesses of the tunnelling oxide layers result in preferred electrical characteristics during program, read and erase modes of operation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an EEPROM memory cell, comprising the steps of:

forming a preliminary field oxide isolation region of first thickness at a face of a semiconductor substrate of first conductivity type, to define an active portion of the face;

forming a tunnelling oxide layer on the active portion of the face, adjacent the preliminary field oxide isolation region;

forming a first conductive layer on the tunnelling oxide layer, opposite the active portion of the face;

implanting dopants of second conductivity type through the preliminary field oxide isolation region and into the substrate;

diffusing the implanted dopants of second conductivity type in the substrate while simultaneously growing the preliminary field oxide isolation region to a second thickness greater than the first thickness to thereby form a final field oxide isolation region;

patterning the first conductive layer to form a floating gate electrode; and forming an insulated control electrode on the floating gate electrode, opposite the tunnel oxide layer.

2. The method of claim 1, wherein said first conductive layer forming step comprises forming a first conductive layer on the tunnelling oxide layer and on the preliminary field oxide isolation region; and wherein said implanting step is preceded by the steps of forming a first layer of silicon nitride on the first conductive layer and then etching first layer of silicon nitride and the first conductive layer to expose a top surface of the preliminary field oxide isolation region.

3. The method of claim 2, wherein said step of forming a preliminary field oxide isolation region comprises patterning a first mask to expose an inactive portion of the face of the substrate; and thermally oxidizing the exposed inactive portion of the face to form a preliminary field oxide isolation region.

4. The method of claim 3, wherein said diffusing step comprises growing the preliminary field oxide isolation region using the first layer of silicon nitride as a thermal oxidation mask.

5. The method of claim 4, wherein said step of patterning the first conductive layer to form a floating gate electrode is preceded by the steps of:

forming a second conductive layer on the first conductive layer and on the final field oxide isolation region;

forming a first oxide layer on the second conductive layer;

forming a second layer of silicon nitride on the first oxide layer; and forming a second oxide layer on the second layer of silicon nitride.

6. The method of claim 5, wherein said step of patterning the first conductive layer comprises etching the first and second conductive layers to expose the active portion of the face.

7. The method of claim 6, wherein said step of patterning the first conductive layer comprises etching the second oxide layer, the second layer of nitride, the first oxide layer, the second conductive layer and first conductive layer to expose the active portion of the face.

8. The method of claim 7, wherein said step of forming an insulated control electrode comprises the steps of thermally oxidizing the exposed active portion of the face to form a control electrode insulating layer; and patterning a control electrode on the control electrode insulating layer and on the second oxide layer.

9. The method of claim 8, wherein said step of patterning the control electrode comprises the steps of forming a third conductive layer on the control electrode insulating layer and etching the third conductive layer and second conductive layer to define the insulated control electrode.

10. The method of claim 1, wherein said implanting step is preceded by the step of etching the first conductive layer; and wherein said step of patterning the first conductive layer comprises forming a second conductive layer on the first conductive layer and on the final field oxide isolation region and then etching the first and second conductive layers to define a floating gate electrode.

11. A method of forming an EEPROM memory cell, comprising the steps of:

forming a preliminary field oxide isolation region of first thickness at a face of a semiconductor substrate of first conductivity type;

forming a tunnelling oxide layer on the face, adjacent the preliminary field oxide isolation region;

implanting dopants of second conductivity type through the preliminary field oxide isolation region and into the substrate of first conductivity type to form a preliminary drain region of second conductivity type therein;

growing the preliminary field oxide isolation region to a second thickness greater than the first thickness by oxidizing a portion of the substrate containing the implanted dopants, to form a final field oxide isolation region;

forming a floating gate electrode on the tunneling oxide layer, opposite the face; and forming an insulated control gate electrode on the floating gate electrode, opposite the tunnelling oxide layer.

12. The method of claim 11, wherein said growing step comprises diffusing the implanted dopants of second conductivity type into the substrate to form a drain region which extends to the face, opposite the tunnelling oxide layer.

13. The method of claim 12, wherein said implanting step is preceded by the step of forming a first portion of the floating gate electrode on the tunnelling oxide layer; and wherein said step of forming a floating gate electrode comprises forming a layer of polycrystalline silicon on the final field oxide isolation region.

14. A method of forming an EEPROM memory cell, comprising the steps of:

forming a preliminary field oxide isolation region of first thickness at a face of a semiconductor substrate of first conductivity type, to define an active portion of the face;

forming a tunnelling oxide layer on the active portion of the face, adjacent the preliminary field oxide isolation region;

forming a first conductive layer on the tunnelling oxide layer, opposite the active portion of the face;

forming a first layer of silicon nitride on the first conductive layer, opposite the tunnelling oxide layer;

patterning the first layer of silicon nitride and first conductive layer to expose an upper surface of the preliminary field oxide isolation region;

implanting dopants of second conductivity type through the upper surface of the preliminary field oxide isolation region and into the substrate, using the patterned first layer of silicon nitride as an implant mask;

growing the preliminary field oxide isolation region to a second thickness greater than the first thickness by thermally oxidizing the substrate using the patterned first layer of silicon nitride as an oxidation mask;

removing the patterned first layer of silicon nitride to expose the patterned first conductive layer;

forming a second conductive layer on the first conductive layer;

forming a control electrode insulating layer on the second conductive layer;

patterning the control electrode insulating layer, the second conductive layer and the first conductive layer to expose the active portion of the face;

thermally oxidizing the active portion of the face to form an oxide insulating layer;

forming a third conductive layer on the oxide insulating layer and on the control electrode insulating layer;

patterning the third conductive layer to define a control electrode; and patterning the second and first conductive layers to define a floating gate electrode.

15. A method of manufacturing a nonvolatile semiconductor memory device having a floating gate and a control gate on channel regions of memory cells, comprising the steps of:

(a) forming first field oxide films for separating cell array regions and second field oxide films for separating channel regions of said memory cells;

(b) forming tunnel oxide films over said cell array regions and depositing first polysilicon layers and nitride films over said tunnel oxide films in a sequential manner;

(c) etching and opening partial portions of said nitride films and said first polysilicon layers and forming buried diffusion layers extended in the vertical direction thereon by implanting dopants;

(d) growing oxide films of said buried diffusion layers by a given thickness;

(e) removing said nitride films, sequentially forming second polysilicon layers and interlayer insulating layers over said first polysilicon layers, patterning said formed layers, and forming floating gate patterns; and (f) forming and patterning third polysilicon layers over said cell array regions, thereby forming control gates extended in the horizontal direction between said second field oxide films via said interlayer insulating layers.

16. The method as recited in claim 15, wherein said step (e) is comprised of the steps of:

growing first interlayer oxide films;

depositing interlayer nitride films over a corresponding first oxide layer; and growing second interlayer oxide films over a corresponding interlayer insulating film, thereby forming interlayer insulating layers.

17. The method as recited in claim 15, wherein said step (d) is comprised of the steps of:

etching partial portions of said first polysilicon layers and said nitride films and removing partial portions of said second field oxide films, thereby exposing a substrate.

* * * * *

UNITED STATES PATENT AND TRADEMARK OFFICE
CERTIFICATE OF CORRECTION

PATENT NO. : 5,888,871
DATED : March 30, 1999
INVENTOR(S) : Cho et al.

It is certified that error appears in the above-identified patent and that said Letters Patent is hereby corrected as shown below:

Column 6, Line 49    Please delete "preliminary"

Signed and Sealed this

Twenty-eighth Day of September, 1999

Attest:

Q. TODD DICKINSON

*Attesting Officer*    *Acting Commissioner of Patents and Trademarks*